(12) United States Patent
Levinger et al.

(10) Patent No.: US 9,787,249 B2
(45) Date of Patent: Oct. 10, 2017

(54) SYSTEM AND METHOD FOR CONTROLLING A VOLTAGE CONTROLLED OSCILLATOR

(71) Applicant: SEMICONDUCTOR COMPONENTS INDUSTRIES, LLC, Phoenix, AZ (US)

(72) Inventors: Run Levinger, Tel-Aviv (IL); Jakob Vovnoboy, Haifa (IL)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 15/423,311

(22) Filed: Feb. 2, 2017

(65) Prior Publication Data

US 2017/0179882 A1     Jun. 22, 2017

Related U.S. Application Data

(63) Continuation of application No. 15/188,010, filed on Jun. 21, 2016, now Pat. No. 9,602,050, which is a continuation of application No. 14/976,322, filed on Dec. 21, 2015, now Pat. No. 9,385,729.

(51) Int. Cl.
| | | |
|---|---|---|
| *H03L 7/06* | (2006.01) | |
| *H03B 5/12* | (2006.01) | |
| *H03L 7/099* | (2006.01) | |
| *H03L 7/089* | (2006.01) | |

(52) U.S. Cl.
CPC ........... *H03B 5/124* (2013.01); *H03B 5/1212* (2013.01); *H03L 7/0891* (2013.01); *H03L 7/099* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 8,508,308 | B2 * | 8/2013 | Dong ..................... | H03L 7/08 327/147 |
| 2005/0046494 | A1 * | 3/2005 | Lee ........................ | H03K 3/354 331/46 |
| 2005/0068117 | A1 * | 3/2005 | Banerjee ................ | H03L 1/00 331/117 FE |
| 2005/0134336 | A1 * | 6/2005 | Goldblatt .............. | H03L 5/00 327/156 |

(Continued)

*Primary Examiner* — Adam Houston
(74) *Attorney, Agent, or Firm* — Iselin Law, PLLC

(57) ABSTRACT

An electrical circuit includes: at least one inductor, at least one varactor, and at least two transistors, all of which electrically arranged to form a voltage controlled oscillator (VCO) having an oscillation frequency; wherein the at least two transistors includes a first transistor and a second transistor; wherein the first transistor has a first bulk terminal and a first parasitic diode disposed between the first bulk terminal and the first transistor; wherein the second transistor has a second bulk terminal and a second parasitic diode disposed between the second bulk terminal and the second transistor; wherein application of a first control voltage to the first bulk terminal, application of a second control voltage to the second bulk terminal, or application of first and second control voltages to the first and second bulk terminals, respectively, is effective to change the oscillation frequency of the VCO.

17 Claims, 4 Drawing Sheets

(56) References Cited

U.S. PATENT DOCUMENTS

| | | | | |
|---|---|---|---|---|
| 2006/0267693 | A1* | 11/2006 | Buell | H03L 7/10 331/16 |
| 2008/0007364 | A1* | 1/2008 | Chiba | H03B 5/1228 331/177 V |
| 2010/0073051 | A1* | 3/2010 | Rao | H03L 7/0898 327/157 |
| 2010/0148881 | A1* | 6/2010 | Moussavi | H03L 7/0814 331/36 C |
| 2010/0253402 | A1* | 10/2010 | Awata | G01S 19/29 327/156 |
| 2010/0264964 | A1* | 10/2010 | Furuta | H03L 7/0893 327/157 |
| 2011/0080199 | A1* | 4/2011 | Yen | H03L 7/093 327/157 |
| 2012/0049913 | A1* | 3/2012 | Tadjpour | H03L 7/104 327/157 |
| 2012/0146692 | A1* | 6/2012 | Yun | H03L 7/087 327/157 |
| 2013/0027101 | A1* | 1/2013 | Cherkassky | H03L 7/0995 327/157 |
| 2013/0106476 | A1* | 5/2013 | Joubert | H03L 1/00 327/156 |
| 2013/0257494 | A1* | 10/2013 | Nikaeen | H03M 3/458 327/156 |
| 2013/0300471 | A1* | 11/2013 | Yang | H03L 7/00 327/157 |
| 2013/0342247 | A1* | 12/2013 | Chern | H03L 7/0995 327/157 |
| 2015/0180414 | A1* | 6/2015 | Lee | H03B 7/06 327/157 |
| 2015/0372682 | A1* | 12/2015 | Alexeyev | H03L 7/085 327/156 |
| 2016/0006442 | A1* | 1/2016 | Lahiri | H03L 7/089 327/157 |
| 2016/0036453 | A1* | 2/2016 | Frank | H03L 7/099 327/156 |

* cited by examiner

SYSTEM AND METHOD FOR CONTROLLING A VOLTAGE CONTROLLED OSCILLATOR

CROSS REFERENCE TO RELATED APPLICATIONS

This application is a continuation application that claims the benefit of U.S. Non-Provisional application Ser. No. 15/188,010, filed Jun. 21, 2016, which is a continuation application that claims the benefit of U.S. Non-Provisional application Ser. No. 14/976,322, filed Dec. 21, 2015, which issued on Jul. 5, 2016 as U.S. Pat. No. 9,385,729, the entire disclosure of each is incorporated herein by reference.

BACKGROUND

The present invention relates to a voltage controlled oscillator, and more specifically, to a system and method for controlling a voltage controlled oscillator.

A phase lock loop (PLL) is a well-known electronic closed loop feedback control circuit typically used for frequency/timing control in a variety of applications. The PLL provides an output signal that is locked in phase of an input reference signal. A voltage controlled oscillator (VCO) is an integral part of the PLL that produces an output frequency signal that varies proportionally to a control voltage input to the VCO. To cover a wide frequency range and get low phase noise, stitched digital bands or one large band may be employed. However, the use of one large band may result in gain variation, and since the oscillation frequency of the VCO may drift with variation in temperature or fabrication processes, a large overlap between the stitched bands may be needed to account for the frequency drift, but such a design may affect other performance characteristics of the PLL, such as tuning range or phase noise. Accordingly, and while existing PLLs may be suitable for their intended purpose, the art of PLLs may be advanced by using alternative methods of controlling the VCO within the PLL.

SUMMARY

According to an embodiment of the present invention, an electrical circuit includes: at least one inductor, at least one varactor, and at least two transistors, all of which electrically arranged to form a voltage controlled oscillator (VCO) having an oscillation frequency; wherein the at least two transistors includes a first transistor and a second transistor; wherein the first transistor has a first bulk terminal and a first parasitic diode disposed between the first bulk terminal and the first transistor; wherein the second transistor has a second bulk terminal and a second parasitic diode disposed between the second bulk terminal and the second transistor; wherein application of a first control voltage to the first bulk terminal, application of a second control voltage to the second bulk terminal, or application of first and second control voltages to the first and second bulk terminals, respectively, is effective to change the oscillation frequency of the VCO.

According to another embodiment of the present invention is a method of operating a voltage controlled oscillator (VCO), the VCO including at least one inductor, at least one varactor, and first and second transistors having respective first and second bulk terminals, the method including: applying a first control voltage to the first bulk terminal of the first transistor causing a change in an oscillation frequency of the VCO.

DETAILED DESCRIPTION

Figure 1:
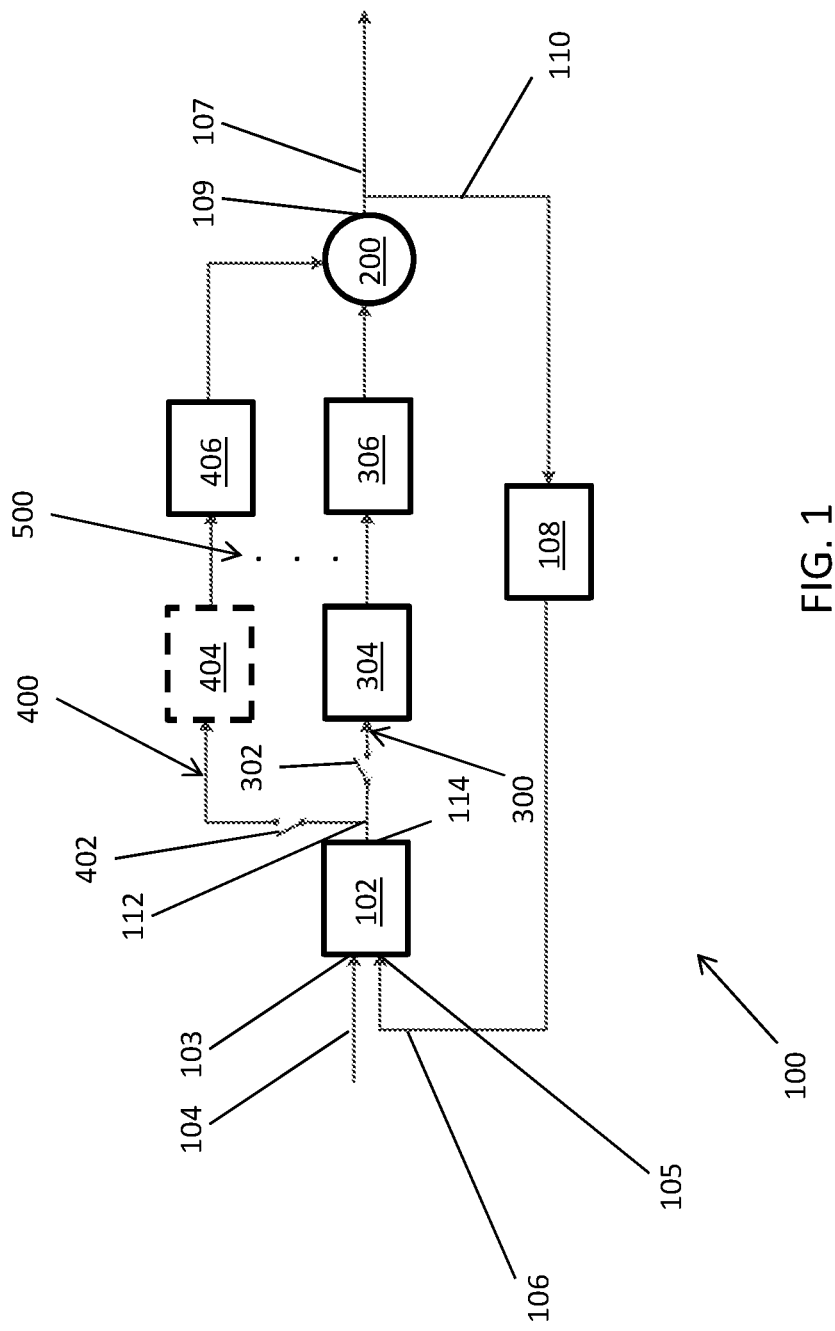
FIG. 1 depicts a block diagram of a PLL circuit in accordance with an embodiment of the invention.

FIG. 1 depicts a block diagram of a phase lock loop (PLL) circuit 100 in accordance with an embodiment. A phase frequency detector (PFD) 102 receives at a reference input 103 a reference signal 104, which may be a clock signal or any other type of signal that the PLL circuit 100 is tracking, and receives at a feedback input 105 a feedback signal 106 from a divider element 108, which reduces the frequency of an output signal 107, from an output 109 of a voltage controlled oscillator (VCO) 200, on the feedback signal path 110. The PFD 102 determines a difference in phase and frequency between the reference signal 104 and the feedback signal 106, and outputs an "up" or "down" control signal 112 based on whether the frequency of the feedback signal 106 is lagging or leading the frequency of the reference signal 104. The output 114 of the PFD 102 is switchably connectable and disconnectable to a first signal path 300 via a first switch 302, and is switchably connectable and disconnectable to a second signal path 400 via a second switch 402. In an embodiment, the first signal path 300 has a first charge pump 304 downstream of the PFD 102, and a first loop filter 306 downstream of the first charge pump 304, that is, the first charge pump 304 is electrically disposed between the PFD 102 and the first loop filter 306. In an embodiment, the second signal path 400 optionally (depicted by dashed lines in the block diagram) has a second charge pump 404 downstream of the PFD 102, and a second loop filter 406 downstream of the optional second charge pump 404, that is, the optional second charge pump 404 is electrically disposed between the PFD 102 and the second loop filter 406. The first charge pump 304 and the optional second charge pump 404 control a magnitude of charge stored in the respective first and second loop filters 306, 406, which in turn provide, respectively, a first control voltage 308 and a second control voltage 408 (and 508) to the VCO 200, which is operatively coupled to the first signal path 300 downstream of the first loop filter 306, and is operatively coupled to the second signal path 400 downstream of the second loop filter 406. In an embodiment, the output 114 of the PFD 102 may be switchably connectable and disconnectable to a third or more signal path(s) similar to the second signal path 400 and electrically disposed in parallel with the second signal path 400, the existence of which being represented schematically by ellipses 500 in FIG. 1, the significance of which will be discussed further below.

Figure 2:
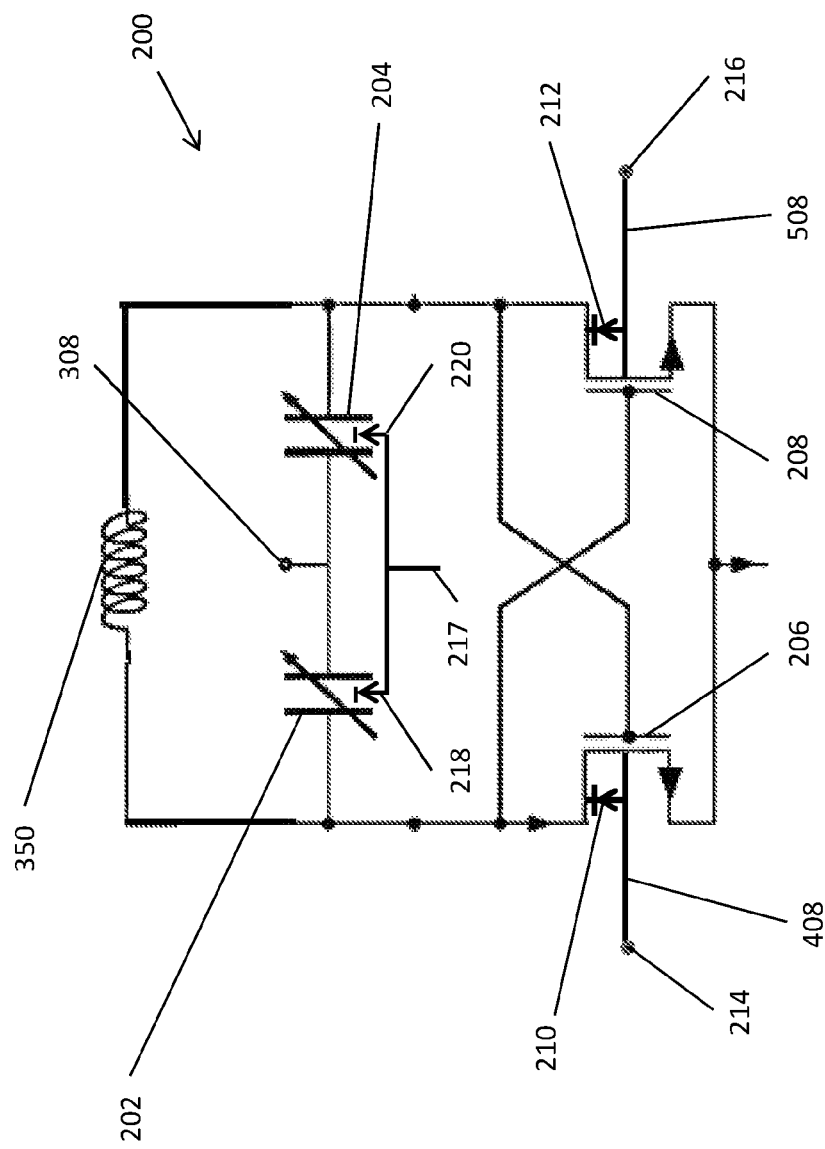
FIG. 2 depicts an example VCO circuit for use in the PLL of FIG. 1 in accordance with an embodiment of the invention.

Reference is now made to FIG. 2 in combination with FIG. 1, where FIG. 2 depicts an example VCO 200, which is exemplary only and not intended to be limiting to the scope of the invention disclosed herein. In an embodiment, the VCO 200 includes at least one metal-oxide-semiconductor (MOS) device such as varactors 202, 204, and transistors 206, 208 (each transistor 206, 208 is more generally herein also referred to as a current controlling device), a circuit arrangement for the example VCO 200 being well known in the art, including commonly used electrical symbols for inductors 350, varactors 202, 204, transistors 206, 208, and diodes for example, and requiring no further detailed description herein. Known in the art is a method of controlling an oscillating frequency of the VCO 200 by using a control voltage, the first control voltage 308 for example (also referred to in the art as Vtune), applied to the varactors 202, 204, or any other capacitive device of the VCO 200, which changes the capacitance of the varactors 202, 204, which affects the capacitance of the VCO 200 as a whole and hence the oscillation frequency of the VCO 200. As depicted in FIG. 1, the VCO is operatively coupled to the first signal path 300 to receive the first control voltage 308, and as depicted in FIG. 2 this first signal path 300, via the first control voltage 308, is operatively coupled to the varactors 202, 204. The output signal 107 from the VCO 200 has a frequency that varies proportionally to the input control voltage, first control voltage 308 or second control voltage 408 (and 508) depending on the state of the first and second switches 302, 402.

The VCO 200, and particularly the MOS transistors 206, 208, unavoidably have parasitic capacitances, which includes a parasitic capacitance of a parasitic drain-bulk diode at the bulk terminals 214, 216 of the transistors 206, 208. The parasitic diodes are depicted schematically in FIG. 2 by reference numerals 210, 212. By applying a secondary control voltage to the bulk terminals 214, 216 of the respective transistors 206, 208, the capacitances of the parasitic diodes 210, 212 will change, which affects the capacitance of the VCO 200 as a whole and hence the oscillation frequency of the VCO 200. In an embodiment, the capacitance of the parasitic diode varies according to the following equation:

$$C_{pn,diode}=C_{jo}/\text{SQRT}(1+(V_{BD}/(V_{bi}(T))));$$

where: $C_{pn,diode}$=pn junction diode capacitance; $C_{jo}$=zero bias junction capacitance; $V_{BD}$=reverse bias voltage of the diode; and, $V_{bi}$=built-in potential as a function of temperature T.

As depicted in FIG. 1, the VCO is operatively coupled to the second signal path 400 to receive the second control voltage 408 (and 508), and as depicted in FIG. 2 this second signal path 400, via the second control voltage 408 (and 508), is operatively coupled to the bulk terminal 214 (and 216) of transistor 206 (and 208). Also depicted in FIG. 2 is another control voltage 217 applied to the bulk terminals 218 and 220 of the varactors 202 and 204, which may be provided by a third signal path, discussed above, electrically disposed in parallel with the second signal path 400 as depicted by the ellipses 500 in FIG. 1.

It will be appreciated from the foregoing that the number of auxiliary control paths to the VCO 200 may be varied depending on how many transistor bulk terminals the VCO 200 has for affecting the parasitic capacitances of the associated parasitic drain-bulk diodes. Any number of auxiliary control paths is contemplated and considered to be within the scope of the invention disclosed herein.

In an embodiment, the VCO 200 may operate in a first state with the first switch 302 open and the second switch 402 closed, may operate in a second state with the first switch 302 closed and the second switch 402 open, and may operate in a third state with the first switch 302 closed and the second switch 402 closed. The first state of operation may be useful for calibrating the PLL circuit 100 to compensate for temperature or process variations, the second state of operation may be useful for controlling a work cycle of the PLL circuit 100 after calibration, and the third state of operation may be useful for providing dual path control of the PLL circuit 100. In an embodiment operating in the third state of operation, the second signal path 400 may be used as a background path with slow constants that react when the first (normal) signal path 300 has reached its tuning limits. By selective switching of the first switch 302, the second switch 402, or other switches (represented by ellipses 500 for example), a dual or multi control path self-healing PLL may be achievable.

Figure 3:
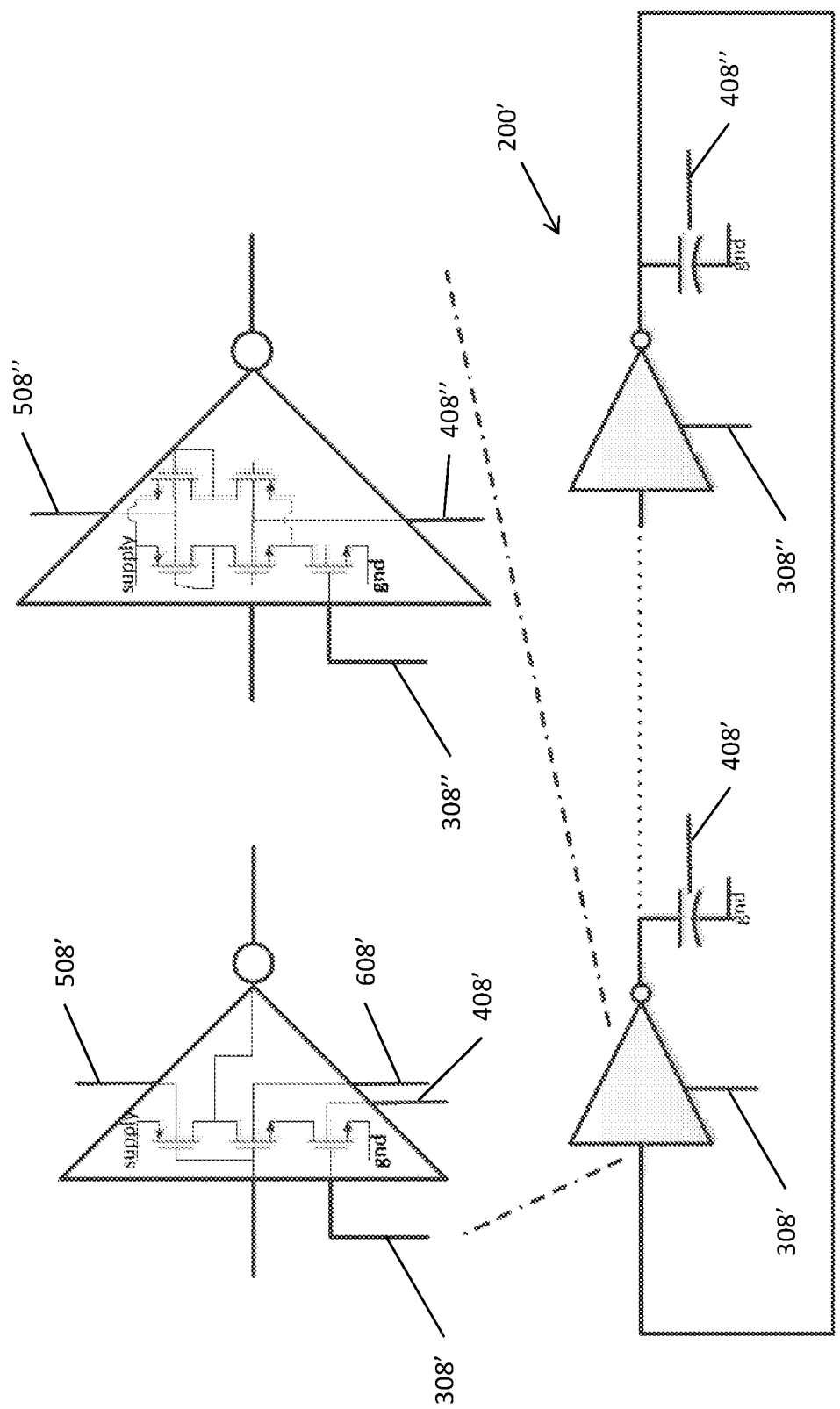
FIG. 3 depicts an example ring VCO circuit for use in the PLL of FIG. 1 in accordance with an embodiment of the invention.

Reference is now made to FIG. 3, which depicts an example ring VCO circuit 200' for use in the PLL 100 of FIG. 1 in accordance with an embodiment of the invention, where a first control voltage 308', 308" is synonymous with the first control voltage 308 of FIG. 2, the second control voltage 408', 408" is synonymous with the second control voltage 408 of FIG. 2, and the additional control voltages 508', 508" and 608' are synonymous with the additional control voltages via ellipses 500 of FIG. 1.

Figure 4:
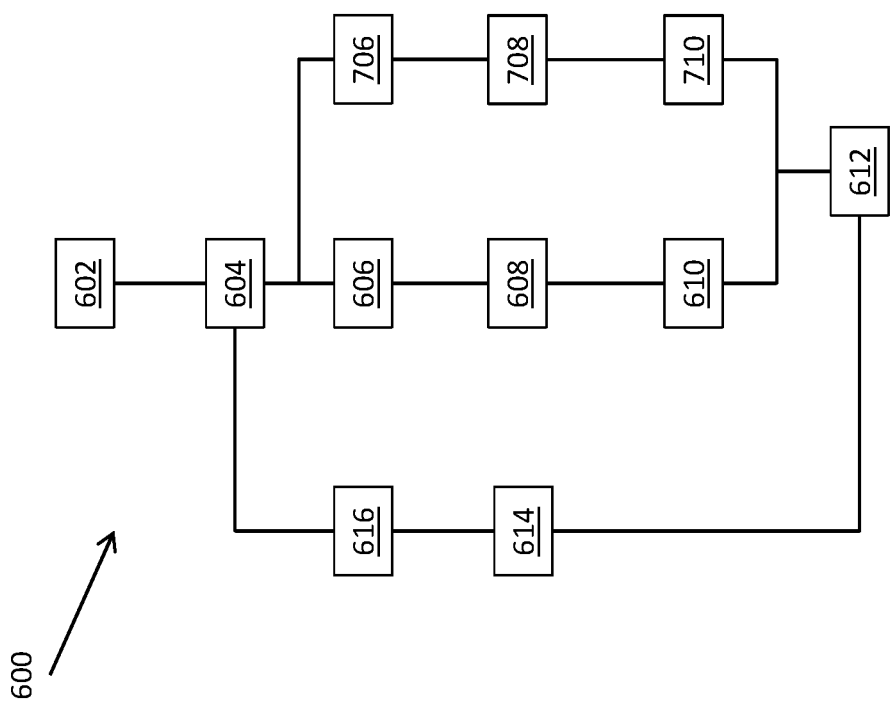
FIG. 4 depicts a flowchart of a method of operating a PLL circuit in accordance with an embodiment of the invention.

From the foregoing, it will be appreciated that an embodiment includes a method of operating a PLL circuit 100. For example, in an embodiment with reference to FIG. 4, a method 600 of operating a phase locked loop circuit 100, includes: generating 604 via a PFD 102 an output control signal 112; switching closed 606 a first signal path 300 having a first filter 306, and permitting the control signal to transmit along the first signal path 300 wherein the first filter 306 filters the control signal and produces a first filtered control signal (first control voltage) 308; switching closed 706 a second signal path 400 having a second filter 406, and permitting the control signal to transmit along the second signal path 400 wherein the second filter 406 filters the control signal and produces a second filtered control signal (second control voltage) 408 (and 508); applying 610 the first filtered control signal 308 to a varactor 202, 204 of a VCO 200, wherein the first filtered control signal 308 affects a capacitance of the varactor and an oscillating frequency of the VCO 200; and applying 710 the second filtered control signal 408 (and 508) to a bulk terminal 214 (and 216) of the VCO 200, wherein the second filtered control signal 408 (and 508) affects a parasitic capacitance at the bulk terminal 214 (and 216) of the VCO 200 and the oscillating frequency of the VCO 200.

In an embodiment, the method of operating the PLL circuit 100 includes the first filtered control signal 308 and the second filtered control signal 408 (and 508) being applied concurrently with each other.

In an embodiment, the method of operating the PLL circuit 100 includes the first filtered control signal 308 and the second filtered control signal 408 (and 508) are applied independently of each other.

In an embodiment, the method of operating the PLL circuit 100 includes: generating 612 via the VCO 200 an output signal 107; providing 614 the output signal 107 of the VCO 200 to the PFD 102 via a feedback signal path 110; and providing 602 a reference signal 104 to the PFD 102.

In an embodiment, the method of operating the PLL circuit 100 includes: reducing 616 a frequency of the output signal 107 of the VCO 200 in the feedback signal path 110, and providing the reduced frequency feedback signal 106 to the PFD 102.

In an embodiment, the method of operating the PLL circuit 100 includes: controlling 608 a magnitude of charge of the control signal 112 in the first signal path 300 via a first charge pump 304.

In an embodiment, the method of operating the PLL circuit 100 includes: controlling 708 a magnitude of charge of the control signal 112 in the second signal path 400 via a second charge pump 404.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A voltage controlled oscillator (VCO) circuit comprising:
    an arrangement of metal-oxide-semiconductor (MOS) transistors providing an output signal having an oscillation frequency, the oscillation frequency controlled by one or more control voltage inputs,
    wherein at least one MOS transistor in the arrangement has a bulk terminal that accepts a first of said one or more control voltage inputs, enabling said first control voltage input to change a parasitic capacitance of the at least one MOS transistor.

2. The circuit of claim 1, wherein the arrangement comprises a ring of MOS transistor inverters.

3. The circuit of claim 2, wherein each inverter includes a load transistor having a gate that accepts a second one of said one or more control voltage inputs.

4. The circuit of claim 1, wherein the arrangement is coupled to at least one inductor and at least one varactor.

5. The circuit of claim 4, wherein the at least one varactor has a terminal that accepts a second one of said one or more control voltage inputs, enabling said second control voltage input to change a capacitance of the at least one varactor.

6. The circuit of claim 1, wherein a second MOS transistor in the arrangement has a bulk terminal that accepts a second one of said one or more control voltage inputs, enabling said second control voltage input to change a parasitic capacitance of the second MOS transistor.

7. The circuit of claim 6, wherein a third MOS transistor in the arrangement has a bulk terminal that accepts a third one of said one or more control voltage inputs, enabling said third control voltage input to change a parasitic capacitance of the third MOS transistor.

8. The circuit of claim 1, wherein the VCO circuit is part of a phase lock loop (PLL) comprising:
    a phase difference detector that determines a difference in phase between a reference signal and a feedback signal;
    one or more signal paths each including a loop filter that provides a respective one of said one or more control voltage signals in response to a control signal from the phase difference detector; and
    a feedback signal path that provides the feedback signal to the phase difference detector in response to the output signal.

9. The circuit of claim 8, wherein said one or more control voltage signals comprise multiple control voltage signals, and said one or more signal paths comprise multiple signal paths.

10. The circuit of claim 9, wherein at least one of the multiple signal paths is switchably connectable to and disconnectable from the phase difference detector.

11. A method of operating a phase lock loop (PLL), the method comprising:
    generating a control signal indicating whether a feedback signal leads or lags a reference signal;
    producing, in response to the control signal, one or more control voltage inputs for a voltage controlled oscillator (VCO) having at least one metal-oxide-semiconductor (MOS) transistor;
    applying a first one of the one or more control voltage inputs to a bulk terminal of the at least one MOS transistor to affect a parasitic capacitance;
    providing, with the VCO, an output signal having an oscillation frequency controlled by the one or more control voltage inputs; and
    deriving the feedback signal from the output signal.

12. The method of claim 11, wherein the VCO has multiple MOS transistors, and wherein said applying includes applying said first control voltage input to bulk terminals of the multiple MOS transistors to affect parasitic capacitances of each.

13. The method of claim 11, wherein the VCO has multiple MOS transistors, and wherein the method further comprises applying different ones of the one or more control voltage inputs to bulk terminals of different MOS transistors to affect parasitic capacitances of each.

14. The method of claim 13, wherein said producing employs multiple signal paths to convert the control signal into said different ones of the one or more control voltage inputs.

15. The method of claim 11, wherein said producing employs multiple signal paths to convert the control signal into multiple ones of said control voltage inputs.

16. The method of claim 15, further comprising switchably connecting the control signal among the multiple signal paths.

17. The method of claim 11, further comprising applying a second one of the one or more control voltages to a varactor that affects the oscillation frequency.

* * * * *